United States Patent
Kammula et al.

(10) Patent No.: US 7,973,603 B2
(45) Date of Patent: Jul. 5, 2011

(54) LOW-NOISE AMPLIFIER SUITABLE FOR USE IN A TELEVISION RECEIVER

(75) Inventors: Abhishek V. Kammula, Austin, TX (US); Aslamali A. Rafi, Austin, TX (US); George Tyson Tuttle, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 34 days.

(21) Appl. No.: 12/493,034

(22) Filed: Jun. 26, 2009

(65) Prior Publication Data
US 2010/0328542 A1 Dec. 30, 2010

(51) Int. Cl.
*H03G 3/10* (2006.01)
(52) U.S. Cl. .......... 330/284; 330/188; 330/253; 330/301
(58) Field of Classification Search .............. 330/253, 330/276, 284, 301, 188, 283
See application file for complete search history.

(56) References Cited

U.S. PATENT DOCUMENTS
6,809,581 B2 * 10/2004 Rofougaran et al. ......... 330/301
7,081,796 B2      7/2006 Krone
7,446,613 B2 * 11/2008 Westwick et al. ............ 330/311
7,596,364 B2 *  9/2009 Sjoland ....................... 455/341

OTHER PUBLICATIONS

W. Zhuo, X. Li, S. Shekhar, S. H. K. Embabi, J. Pineda De Gyvez, D. J. Allstot, and E. Sanchez-Sinencio; A Capacitor Cross-Coupled Common-Gate Low-Noise Amplifier; Journal; Dec. 2005; pp. 875-879; IEEE Transactions on Circuits and Systems-II: Express Briefs, vol. 52 No. 12; IEEE, 10662 Los Vaqueros Circle, Los Alamitos, CA, 90720-1264, U.S.A.
Federico Bruccoleri, Eric A. M. Klumperink, and Bram Nuata; Wide-Band CMOS Low-Noise Amplifier Exploiting Thermal Noise Canceling; Journal; Feb. 2004; pp. 275-282; IEEE Journal of Solid-State Circuits, vol. 39, No. 2; IEEE, 10662 Los Vaqueros Circle, Los Alamitos, CA, 90720-1264, U.S.A.
Chun-Huat Heng, Manoj Gupta, Sang-Noon Lee, David Kang, and Bang-Sup Song; A CMOS TV Tuner/Demodulator IC with Digital Image Rejection; Journal; Dec. 2005; pp. 2525-2535; IEEE Journal of Solid-State Circuits, vol. 40, No. 12; IEEE, 10662 Los Vaqueros Circle, Los Alamitos, CA, 90720-1264, U.S.A.

* cited by examiner

*Primary Examiner* — Khanh V Nguyen
(74) *Attorney, Agent, or Firm* — Polansky & Associates, P.L.L.C.; Paul J. Polansky

(57) ABSTRACT

A low-noise amplifier includes a first resistor that receives a first signal of a differential input signal, and a second resistor that receives a second signal of the differential input signal. The amplifier includes a first transconductance device coupled to the first resistor that provides a first signal of a differential output signal, and a second transconductance device coupled to the second resistor, that provides a second signal of the differential output signal. The receiver also includes a first capacitor coupled between the first resistor input and a control electrode on the second transconductance device, and a second capacitor coupled between the second resistor input and a control electrode on the first transconductance device. The low-noise amplifier can include additional gain stages.

20 Claims, 4 Drawing Sheets

LOW-NOISE AMPLIFIER SUITABLE FOR USE IN A TELEVISION RECEIVER

FIELD OF THE DISCLOSURE

The present disclosure relates generally to amplifiers and, more particularly relates to a low-noise amplifier suitable for use in a television receiver.

BACKGROUND

A radio frequency (RF) signal includes useful information that is modulated onto a carrier signal. An RF receiver retrieves the useful information from the RF signal. RF receivers are used in a wide variety of applications such as television transmission, cellular telephones, pagers, global positioning systems (GPS), cable modems, cordless phones, satellite radios, and the like. As used herein, an RF signal means an electro-magnetic signal having a frequency in a spectrum from about 3 kilohertz (kHz) to thousands of gigahertz (GHz), regardless of the medium through which such signal is conveyed. Thus an RF signal may be transmitted through air, free space, coaxial cable, fiber optic cable, etc.

In many broadcast RF transmission systems, the frequency spectrum is relatively wide and is divided into separate channels that include different information. A television receiver receives the wide spectrum RF signal, mixes a desired channel to a convenient intermediate frequency (IF) to make it easier to filter, and then convert it to baseband where the information may be processed further. For example, a television receiver may translate a channel in the frequency spectrum of 48 megahertz (MHz) to 870 MHz to an intermediate frequency of 44 MHz.

Often, the RF signal power level in a particular channel is low, and needs to be amplified before being mixed or otherwise processed in the receiver. Thus a television receiver typically includes one or more low-noise amplifiers to amplify the received signal prior to mixing. However, to provide linear gain, a wide dynamic range, and a large gain range in the presence of small and large signals, television receivers typically employ several narrow band low-noise amplifiers to cover the full frequency spectrum, and it has been difficult to design high quality low-noise amplifiers for wideband applications that provide the desired performance.

What is needed, then, are wideband low-noise amplifier designs for applications such as television receivers that retain the high performance of discrete low-noise amplifiers.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items.

DETAILED DESCRIPTION

In general, a receiver as described herein uses a low-noise amplifier (LNA) to receive and amplify a desired signal, with a high degree of linearity, a wide dynamic range, and a large gain range. The desired signal is typically received as a part of a wide-band signal that includes large signal blockers. The LNA has low input impedance which permits the use of lower voltage levels in the devices used to implement the design. The design permits a reduction in the number of external components to a main integrated circuit die which includes the LNA. Thus, high quality, low cost, and compact size are obtained simultaneously.

Figure 1:
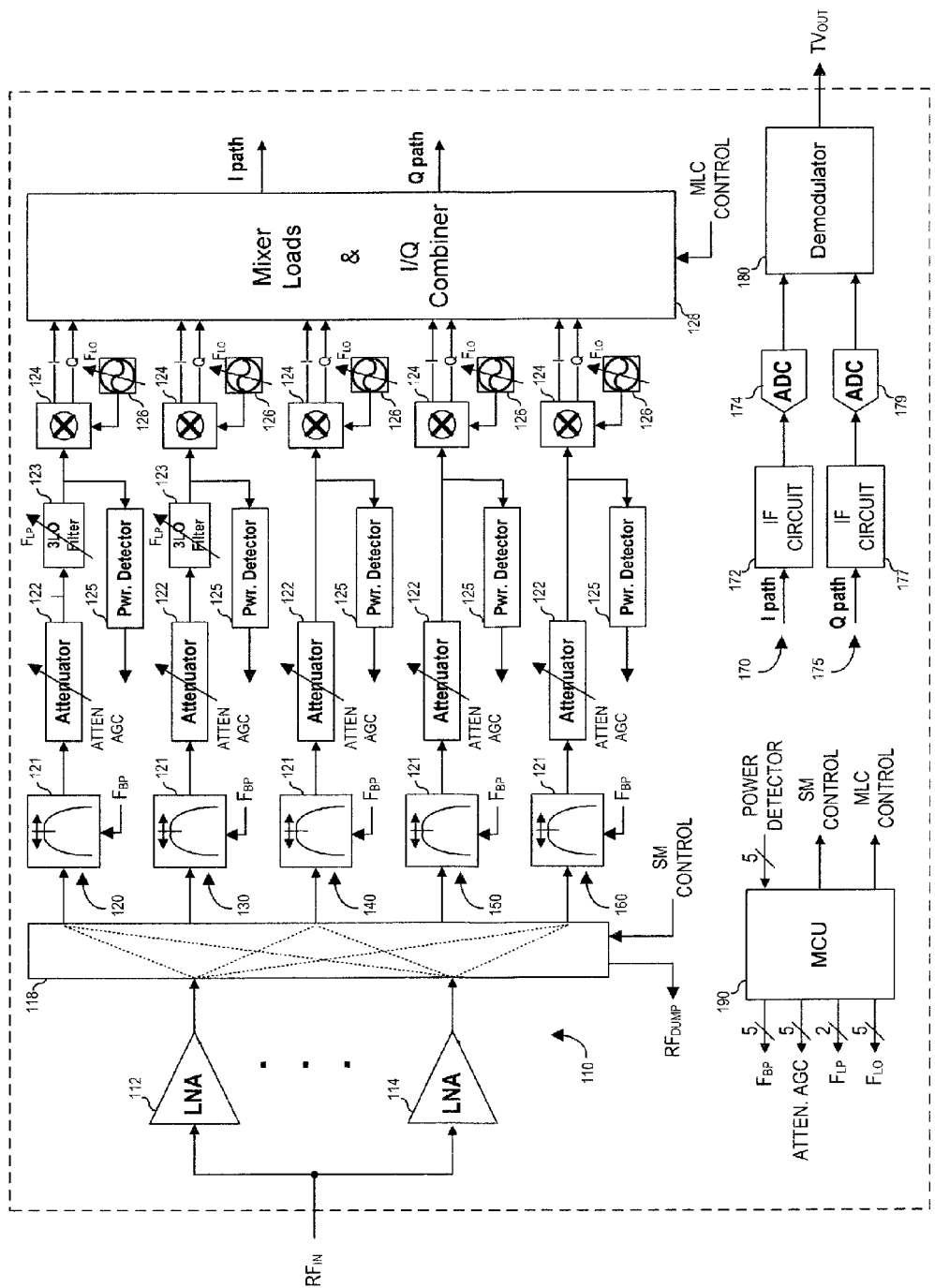
FIG. 1 illustrates in partial block diagram and partial schematic form a television receiver according to an embodiment of the present invention.

FIG. 1 illustrates in partial block diagram and partial schematic form an embodiment of a television receiver 100. Receiver 100 includes an input section 110, first through fifth radio frequency (RF) sections 120, 130, 140, 150, and 160, a mixer load/in-phase/quadrature (I/Q) combiner 128, a first intermediate frequency (IF) section 170, a second IF section 175, a demodulator 180, and a micro-controller unit (MCU) 190. Input section 110 includes a first LNA stage 112, one or more additional LNA stages, labeled generally as LNA stage 114, and a switch matrix 118. Each RF section 120, 130, 140, 150, and 160 includes a tracking bandpass filter 121, an attenuator 122, a mixer 124, a power detector 125, and a local oscillator 126. Further, first RF section 120, and second RF section 130 each include a filter 123. IF section 170 includes an IF circuit 172 and an ADC 174. IF section 175 includes an IF circuit 177 and an ADC 179.

Input section 110 receives an RF input signal $RF_{IN}$. LNA stages 112 through 114 each have an input for receiving signal $RF_{IN}$, and an output. Switch matrix 118 has a first input connected to the output of LNA STAGE 112, one or more additional inputs connected to the output of LNA STAGE 114, and a third input for receiving a switch matrix control signal labeled "SM CONTROL," a first through a fifth RF signal output, and an RF dump output labeled "$RF_{DUMP}$".

RF sections 120, 130, 140, 150, and 160 each have an input for receiving an RF signal input that is connected to an RF signal output of switch matrix 118. As such, the first RF signal output is connected to the input of RF section 120, the second RF signal output is connected to the input of RF section 130, the third RF signal output is connected to the input of RF section 140, the fourth RF signal output is connected to the input of RF section 150, and the fifth RF signal output is connected to the input of RF section 160. RF sections 120, 130, 140, 150, and 160 also each have a first output for providing an in-phase IF output signal, and a second output for providing a quadrature IF output signal.

In each of RF sections 120 and 130, tracking bandpass filter 121 has a first input for receiving the associated RF output of switch matrix 118, a second input for receiving a tuning signal $F_{BP}$, and an output. Attenuator 122 has a first input connected to the output of tracking bandpass filter 121, a second input for receiving an attenuation control signal ATTEN AGC, and an output. Filter 123 has a first input connected to the output of attenuator 122, a second input for receiving a cutoff frequency adjustment signal $F_{LP}$, and an output. Local oscillator 126 has an input for receiving a local oscillator tuning signal $F_{LO}$, a first output for providing two mixing signals, including an in-phase mixing signal and a quadrature mixing signal, and a second output for providing a test signal TEST connected to the first input of tracking bandpass filter 121. Mixer 124 has a first input that is connected to the output of filter 123, a second input connected to the output of local oscillator 126, a first output for providing the in-phase IF output signal, and a second output for providing the quadrature IF output signal.

Power detector 125 has an input that is connected to the output of filter 123, and an output. RF sections 140, 150, and 160 include elements that are connected together similarly to RF sections 120 and 130, except that, with no filter 123, the output of attenuator 122 is connected to the first input of mixer 124 and to the input of power detector 125. In an alternative embodiment (not illustrated), filter 123 does not include a second input, but rather, is a lowpass filter with a cutoff frequency that is approximately equal to twice the frequency of the low end of the frequency range tuned by receiver 100. In another embodiment (not illustrated), one or more of RF sections 140, 150, and 160 include a filter similar to filter 123.

Mixer load/I/Q combiner 128 has a first input pair connected to the first and second output of RF section 120, a second input pair connected to the first and second output of RF section 130, a third input pair connected to the first and second output of RF section 140, a fourth input pair connected to the first and second output of RF section 150, a fifth input pair connected to the first and second output of RF section 160, a sixth input for receiving a mixer load/I/Q combiner control signal labeled "MLC CONTROL," a first output for providing an in-phase IF signal, and a second output for providing a quadrature IF signal.

IF section 170 receives the in-phase IF signal output from mixer load/IQ combiner 128, and provides an in-phase digital signal to demodulator 180. Thus, IF circuit 172 has an input for receiving the in-phase IF signal, and an output. ADC 174 has an input connected to the output of IF circuit 172 and an output for providing a digitized output signal. IF section 175 receives the quadrature IF signal output from mixer load/I/Q combiner 128, and provides a digital signal to demodulator 180. Thus, IF circuit 177 has an input for receiving the quadrature IF signal, and an output. ADC 179 has an input connected to the output of IF circuit 177 and an output for providing a digitized output signal. Demodulator 180 has a first input connected to the output of ADC 174, a second input connected to the output of ADC 179, and an output for providing a demodulated output signal labeled "$TV_{OUT}$".

MCU 190 has five inputs, each connected to the output of a power detector 125, five outputs for providing signals $F_{BP}$, five outputs for providing signals ATTEN AGC, two outputs for providing signals $F_{LP}$, five outputs for providing signals $F_{LO}$, an output connected to the third input of switch matrix 118 for providing signal SM CONTROL, and an output connected to the sixth input of mixer load/I/Q combiner 128 for providing signal MLC CONTROL. MCU 190 can implement signals $F_{BP}$, ATTEN AGC, $F_{LP}$, $F_{LO}$, SM CONTROL, and MLC CONTROL as discrete outputs, or signals $F_{BP}$, ATTEN AGC, $F_{LP}$, $F_{LO}$, SM CONTROL, and MLC CONTROL can be implemented by placing the appropriate signal values into buffer devices (not illustrated) which provide the outputs.

Signal $RF_{IN}$ is a broadband signal that includes energy from several television signals modulated onto carrier waves at different frequencies. The different carrier waves constitute the television channels from which television content can be received. Signal $RF_{IN}$ can be received from an antenna, from a cable television connection, from another RF signal source, or from a combination thereof. Signal $RF_{IN}$ typically includes television channels in the range of 48 megahertz (MHz) to 1 gigahertz (GHz).

In operation, receiver 100 functions as a television receiver adapted to receive and demodulate signal $RF_{IN}$. MCU 190 is adapted to control the various elements in receiver 100 according to the channel selected by the user. Receiver 100 uses the dual filter architecture in RF sections 120 and 130, and uses a single filter architecture in RF sections 140, 150, and 160. It will be understood after reading this disclosure that different RF sections can be designed to provide filtering and attenuation over different portions of the 48 MHz to 1 GHz range, and that multiple narrow-band RF sections can be easier to design and implement than a single wide-band RF section. Here, RF sections 120, 130, 140, 150, and 160 are each designed to provide filtering and attenuation for a selected frequency range of signal $RF_{IN}$. In a particular embodiment, a first RF section functions in the range of 48 to 120 MHz, a second RF section functions in the range of 120 to 240 MHz, a third RF section functions in the range of 240 to 470 MHz, a fourth RF section functions in the range of 470 to 685 MHz, and a fifth RF section functions in the range of 685 MHz to 1 GHz.

LNA stages 112 through 114 receive and convert signal $RF_{IN}$ to an amplified current. Receiver 100 implements a number of LNA stages 112 through 114 that is related to the desired gain resolution (e.g., proportional to the number of gain steps desired). Switch matrix 118 receives the amplified signal $RF_{IN}$ from LNA stages 112 through 114, and connects each LNA stage 112 through 114 to the particular RF section 120, 130, 140, 150, or 160 that is designed to provide filtering and attenuation for the selected channel, or to the $RF_{DUMP}$ output under the control of MCU 190 via signal SM CONTROL. By switching more or less LNA stages 112 through 114, receiver 100 is able to present signal $RF_{IN}$ to the input of the selected one of RF sections 120, 130, 140, 150, or 160 at a suitable power level for the selected tracking bandpass filter 121, and mixer 124. MCU 190 uses the inputs from the selected one of power detectors 125 to determine the number of LNA stages 112 through 114 to switch to the input of the corresponding RF sections 120, 130, 140, 150, or 160, thus achieving digital automatic gain control in receiver 100. Switch matrix 118 receives signals from LNA stages 112 through 114 that together provide the desired amplification, and switches each of LNA stages 112 through 114 to the particular RF section 120, 130, 140, 150, or 150 that is designed to provide filtering and attenuation for the selected channel.

In a particular embodiment, each LNA stage provides substantially the same amount of gain and the total gain is a linear function of the number of stages. For example, if each LNA stage provides 1 unit of gain, and there are 64 LNA stages, then an input stage will provide from 0 to 64 units of gain in 1 dB steps. In another embodiment, the LNA stages provide a binary weighted amount of gain. For example, if the unit amount of gain is 1 units, and there are 8 LNA stages, then an input stage will provide from 0 to 256 units of gain in 1 unit steps. In yet another embodiment, a first group of LNA stages each provide linear gain, and another group of LNA stages each provide binary weighted gain.

Each tracking bandpass filter 121 is a second-order inductor-capacitor (LC) filter that is implemented as an inductor with an array of switched capacitors, the selection of which functions to tune the center frequency of the passband of tracking bandpass filters 121 under the control of MCU 190 via signals $F_{BP}$, and is further implemented in part on an integrated circuit substrate containing the other elements of receiver 100, and part on an integrated passive device (IPD) die. Attenuators 122 function as separately controllable gain elements under the control of MCU 190 via signals ATTEN AGC. Filters 123 provide additional attenuation above the third harmonic of the mixing signal under the control of MCU 190 via signals $F_{LP}$ to prevent unwanted energy from a neighboring channel from being mixed into the passband. Again, this frequency is important because local oscillators 126 use a digital mixing signal that is a square wave, which has significant energy at the third harmonic. After reading this disclosure, it will be appreciated that a lowpass filter may not be necessary to filter third harmonics of the digital mixing signal frequency for RF sections that handle the higher frequency channels.

Mixers 124 are quadrature mixers that combine the filtered and attenuated RF input signal with the output from local oscillator 126, to produce sum and difference output frequencies:

$$f_1 = f_{RF} + f_{LO} \quad [1]$$

and $$f_2 = f_{RF} - f_{LO} \quad [2]$$

where $f_{RF}$ is the carrier frequency of a desired channel of signal $RF_{IN}$ and $f_{LO}$ is the local oscillator frequency. Local oscillators 126 adjust the frequency of $f_{LO}$ such that the desired channel's spectrum is mixed into a desired IF frequency. In a particular embodiment, the desired IF is 4 MHz, and thus receiver 100 utilizes a low-IF architecture. Thus, to achieve the desired IF, local oscillators 126 are tuned to a frequency that mixes a selected channel to the low IF frequency of 4 MHz, under the control of MCU 190 via signal $F_{LO}$. In other embodiments, receiver 100 may use a high-IF or a direct down conversion architecture. Mixer load/I/Q combiner 128 receives the in-phase and quadrature IF signals from the selected mixer 124 and switches them to the in-phase IF section 170 and the quadrature IF section 175, respectively, under the control of MCU 190 via signal MLC CONTROL.

Each of IF circuits 172 and 177 perform further signal conditioning, including lowpass filtering to pass frequencies below a cutoff frequency of 7 MHz, and further attenuation. MCU 190 further has outputs, not shown in FIG. 1, for adjusting the gain of the signal through IF circuits 172 and 177. ADCs 174 and 179 convert their respective input signals to the digital domain, such that demodulator 180 can demodulate them digitally and provide signal $TV_{OUT}$.

Figure 2:
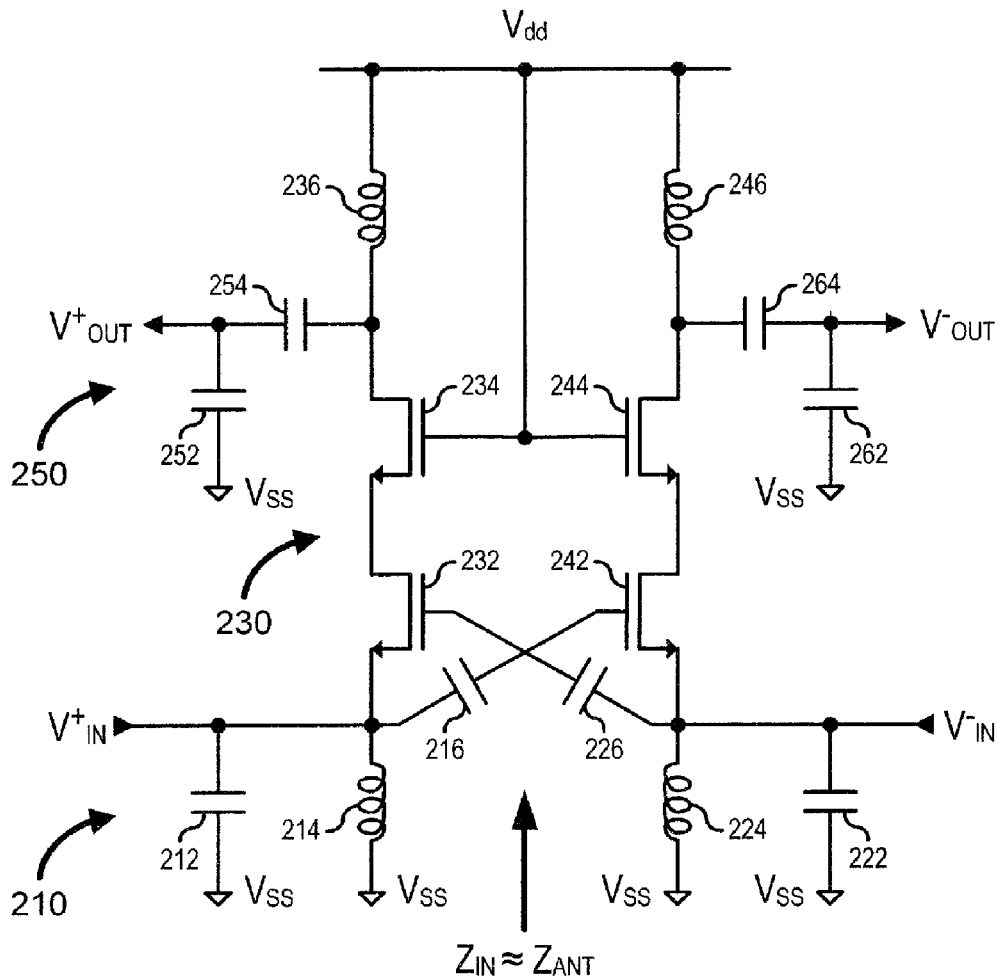
FIG. 2 illustrates in schematic form a low-noise amplifier of the prior art.

FIG. 2 illustrates a schematic of a capacitor cross-coupled low-noise amplifier 200 of the prior art. LNA 200 is a differential voltage amplifier, having differential voltage input terminals labeled "$V^+_{IN}$" and "$N^-_{IN}$" and differential voltage output terminals labeled "$V^+_{OUT}$" and "$V^-_{OUT}$". LNA 200 includes generally an input section 210, a gain section 230, and an output section 250. Input section 210 includes capacitors 212 and 216, and inductor 214 on the $V^+_{IN}$ side, and capacitors 222 and 226, and inductor 224 on the $V^-_{IN}$ side. Capacitor 212 has a first terminal for receiving $V^+_{IN}$ and a second terminal connected to a ground terminal labeled "$V_{SS}$". Inductor 214 has a first terminal connected to the first terminal of capacitor 212 and a second terminal connected to $V_{SS}$. Capacitor 216 has a first terminal connected to the first terminal of capacitor 212 and a second terminal. Capacitor 222 has a first terminal for receiving $V^-_{IN}$ and a second terminal connected to $V_{SS}$. Inductor 224 has a first terminal connected to the first terminal of capacitor 222 and a second terminal connected to $V_{SS}$. Capacitor 226 has a first terminal connected to the first terminal of capacitor 222 and a second terminal.

Gain section 230 includes metal-oxide-semiconductor field effect transistors (MOSFETs) 232, 234, 242, and 244, and inductors 236 and 246. MOSFET 232 has a source connected to the first terminal of capacitor 212, a gate connected to the second terminal of capacitor 226, and a drain. MOSFET 234 has a source connected to the drain of MOSFET 232, a gate connected to a power supply voltage terminal labeled "$V_{dd}$," and a drain. Inductor 236 has a first terminal connected to the drain of MOSFET 234, and a second terminal connected to $V_{dd}$. MOSFET 242 has a source connected to the first terminal of capacitor 222, a gate connected to the second terminal of capacitor 216, and a drain. MOSFET 244 has a source connected to the drain of MOSFET 242, a gate connected to $V_{dd}$, and a drain. Inductor 246 has a first terminal connected to the drain of MOSFET 244, and a second terminal connected to $V_{dd}$.

Output section 250 includes capacitors 252 and 254 on the $V^+_{OUT}$ side, and capacitors 262 and 264 on the $V^-_{OUT}$ side. Capacitor 254 has a first terminal connected the drain of MOSFET 234, and a second terminal for providing $V^-_{OUT}$. Capacitor 252 has a first terminal connected to the second terminal of capacitor 254 and a second terminal connected to $V_{SS}$. Capacitor 264 has a first terminal connected the drain of MOSFET 244, and a second terminal for providing $V^-_{OUT}$. Capacitor 262 has a first terminal connected to the second terminal of capacitor 264 and a second terminal connected to $V_{SS}$.

In operation, input section 210 utilizes parallel resonant LC networks formed by capacitor 212 and inductor 214 on the $V^+_{IN}$ side, and by capacitor 222 and inductor 224 on the $V^-_{IN}$ side, to match the input impedance at a desired frequency range. LNA 200 operates within the passband of the parallel resonant LC networks. With an antenna source impedance of 50 ohms (Ω), LNA 200 can be designed with an input impedance of about 30 to 50Ω to enable higher gain and improved noise figure. The cross-coupled capacitors 216 and 236 also enable improved figure.

Gain section 230 includes a positive signal path and a negative signal path. MOSFET 232 receives an RF signal $V^+_{IN}$ as a voltage signal at the source, and provides an amplified drain-to-source current in response. The amplified drain-to-source current flows in MOSFET 234, producing a voltage signal at the drain of MOSFET 234. Similarly, MOSFET 242 receives the RF signal $V^-_{IN}$ as a voltage signal at the source, and provides an amplified drain-to-source current in response. The amplified drain-to-source current flows in MOSFET 244, producing a voltage signal at the drain of MOSFET 244. MOSFETs 234 and 244 provide improved reverse isolation. Inductors 214 and 236 provide a DC path for bias current to flow in MOSFETS 232 and 234, and inductors 224 and 246 provide a DC path for bias current to flow in MOSFETS 242 and 244.

Output section 250 includes blocking capacitors and output impedance matching capacitors to provide a differential voltage output signals $V^+_{OUT}$ and $V^-_{OUT}$. Capacitor 254 permits the voltage signal at the drain of MOSFET 234 to pass to $V^+_{OUT}$. Capacitor 264 permits the voltage signal at the drain of MOSFET 244 to pass to $V^-_{OUT}$. Capacitors 252 and 262 provide impedance matching for LNA 200.

LNA 200 provides good gain linearity and noise figure. However, because of the parallel resonant LC networks, LNA 200 does not typically provide wideband performance. Also, inductors 214, 224, 236, and 246 are typically discrete elements in LNA 200, or, if implemented on a substrate, typically require large allotments of substrate area.

Figure 3:
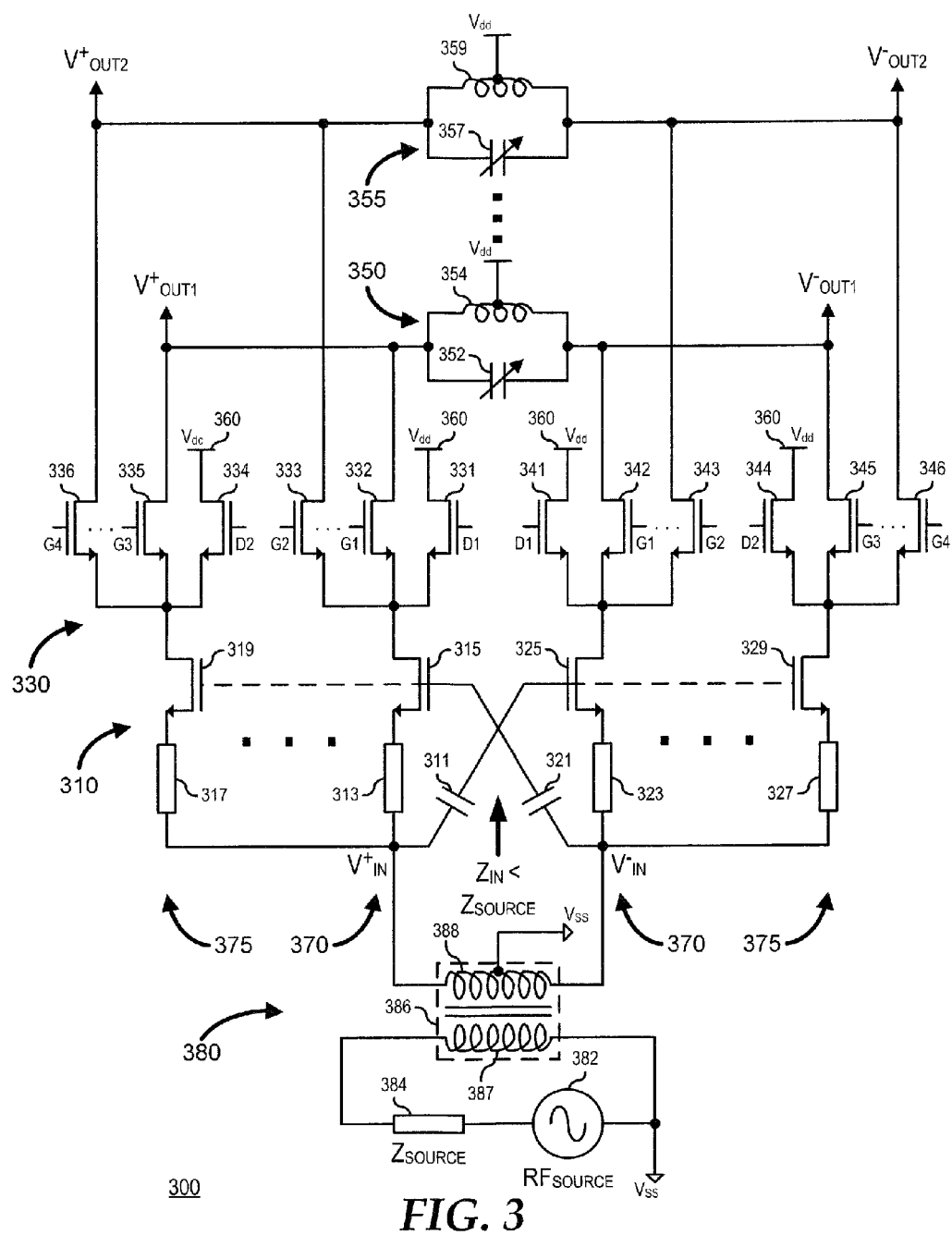
FIG. 3 illustrates in schematic form a front end suitable for use in the receiver of FIG. 1, according to an embodiment of the present invention.

FIG. 3 illustrates a schematic of a front end 300, according to an embodiment of the present disclosure. As shown and described, front end 300 is suitable for use as a portion of a receiver similar to receiver 100, and includes functionality similar to LNA stages 112 through 114, switch matrix 118, and tracking bandpass filters 121 of FIG. 1. Front end 300 is a differential amplifier with differential voltage inputs labeled "$V^+_{IN}$" and "$V^-_{IN}$", a first differential voltage output labeled "$V^+_{OUT1}$" and "$V^-_{OUT1}$", and one or more additional differential voltage output labeled "$V^+_{OUT2}$" and "$V^-_{OUT2}$". Front end 300 includes generally an LNA section 310, a switch matrix section 330, a tracking bandpass filter 350, one or more additional tracking bandpass filters 355, and an input section 380. Each of tracking bandpass filters 350 and 355 are designed to filter signals in a particular frequency range. In a particular embodiment, five tracking bandpass filters 350 and 355 are implemented in front end 300. Here, a first tracking bandpass filter functions in the range of 48 to 120 MHz, a second tracking bandpass filter functions in the range of 120 to 240 MHz, a third tracking bandpass filter functions in the range of 240 to 470 MHz, a fourth tracking bandpass filter functions in the range of 470 to 685 MHz, and a fifth tracking bandpass filter functions in the range of 685 MHz to 1 GHz.

LNA section 310 and switch matrix section 330 are also organized into a first gain stage 370, and one or more additional gains stages 375, as described below. In a particular embodiment, front end 300 has 64 gain stages, shown as representative gain stages 370 and 375. LNA section 310 includes a capacitor 311, a degeneration resistor 313, one or more additional degeneration resistors 317, MOSFET 315, and one or more additional MOSFETs 319 on the $V^+_{IN}$ side, and a capacitor 321, degeneration resistors 323, one or more additional degeneration resistors 327, MOSFET 325, and one or more additional MOSFETs 329 on the $V^-_{IN}$ side.

In LNA section 310 of gain stage 370, capacitor 311 has a first terminal for receiving $V^+_{IN}$, and a second terminal. Degeneration resistor 313 has a first terminal connected to the first terminal of capacitor 311, and a second terminal. MOSFET 315 has a source connected to the second terminal of degeneration resistor 313, a gate, and a drain. Capacitor 321 has a first terminal for receiving $V^-_{IN}$, and a second terminal connected to the gate of MOSFET 315. Degeneration resistor 323 has a first terminal connected to the first terminal of capacitor 321, and a second terminal. MOSFET 325 has a source connected to the second terminal of degeneration resistor 323, a gate connected to the second terminal of capacitor 311, and a drain.

In LNA section 310 of gain stages 375, degeneration resistor 317 has a first terminal connected to the first terminal of capacitor 311 for receiving $V^+_{IN}$, and a second terminal. MOSFET 319 has a source connected to the second terminal of degeneration resistor 317, a gate connected to the second terminal of capacitor 321, and a drain. Degeneration resistor 327 has a first terminal connected to the first terminal of capacitor 321 for receiving $V^-_{IN}$, and a second terminal. MOSFET 329 has a source connected to the second terminal of degeneration resistor 327, a gate connected to the second terminal of capacitor 311, and a drain.

Capacitors 311 and 321 are each implemented as a single large capacitor, with a capacitance of approximately 6.4 picofarads (pF). In another embodiment (not illustrated), capacitors 311 and 321 are implemented as multiple parallel capacitor elements, the sum of which add up to the capacitive values of capacitors 311 and 321. In this embodiment, a single capacitor element is associated with each gain MOSFET in a particular gain stage and is included with it in a common layout cell. Thus, the design is modular and scalable, and the capacitance of each capacitor element is given as:

$$C_{STAGE} = \frac{C_{CONTROL}}{N} \quad [3]$$

where $C_{STAGE}$ is the capacitance of each separate capacitor, $C_{TOTAL}$ is the total capacitance of the associated single capacitor, and N is the number of gain stages. For example, where an LNA has 64 gain stages and the total capacitance of an associated single capacitor is approximately 6.4 pF, each separate capacitor element is designed to have a capacitance of approximately 100 femtofarads.

Switch matrix section 330 has a bank of MOSFETs including a current dump MOSFET 331, a gain MOSFET 332, and one or more additional gain MOSFETs 333 on the $V^+_{IN}$ side. The number of gain MOSFETs 332 and 333 is equal to the number of tracking bandpass filters 350 and 355 that are implemented in front end 300. The $V^+_{IN}$ side also has one or more additional banks of MOSFETs, each including a current dump MOSFET 334, a gain MOSFET 335, and one or more additional gain MOSFETs 336. Switch matrix section 330 also includes a bank of MOSFETs including a current dump MOSFET 341, a gain MOSFET 342, and one or more additional gain MOSFETs 343 on the $V^-_{IN}$ side. The number of gain MOSFETs 342 and 343 is equal to the number of tracking bandpass filters 350 and 355 that are implemented in front end 300. The $V^-_{IN}$ side also has one or more additional banks of MOSFETs including a current dump MOSFET 344, a gain MOSFET 345, and one or more additional gain MOSFETs 346.

In switch matrix section 330 of gain stage 370, dump MOSFET 331 has a source connected to the drain of MOSFET 315, a gate for receiving a dump signal labeled "D1," and a drain connected to $V_{dd}$. Gain MOSFET 332 has a source connected to the drain of MOSFET 315, a gate for receiving a gain signal labeled "G1," and a drain for providing $V^+_{OUT1}$. Gain MOSFET 333 has a source connected to the drain of MOSFET 315, a gate for receiving a gain signal labeled "G2," and a drain for providing $V^+_{OUT2}$. Dump MOSFET 341 has a source connected to the drain of MOSFET 325, a gate for receiving dump signal D1, and a drain connected to $V_{dd}$. Gain MOSFET 342 has a source connected to the drain of MOSFET 325, a gate for receiving gain signal G1, and a drain for providing $V^-_{OUT1}$. Gain MOSFET 343 has a source connected to the drain of MOSFET 325, a gate for receiving gain signal G2, and a drain for providing $V^-_{OUT2}$.

In switch matrix section 330 of gain stage 375, dump MOSFET 334 has a source connected to the drain of MOSFET 319, a gate for receiving a dump signal labeled "D2," and a drain connected to $V_{dd}$. Gain MOSFET 335 has a source connected to the drain of MOSFET 319, a gate for receiving a gain signal labeled "G3," and a drain for providing $V^+_{OUT1}$. Gain MOSFET 336 has a source connected to the drain of MOSFET 319, a gate for receiving a gain signal labeled "G4," and a drain for providing $V^+_{OUT2}$. Dump MOSFET 344 has a source connected to the drain of MOSFET 329, a gate for receiving dump signal D2, and a drain connected to $V_{dd}$. Gain MOSFET 345 has a source connected to the drain of MOSFET 329, a gate for receiving gain signal G3, and a drain for providing $V^-_{OUT1}$. Gain MOSFET 346 has a source connected to the drain of MOSFET 329, a gate for receiving gain signal G4, and a drain for providing $V^-_{OUT2}$.

Tracking bandpass filter 350 includes a variable capacitor 352 and an inductor 354. Variable capacitor 352 has a first terminal connected to the drains of gain MOSFETs 332 and 335, and a second terminal connected to the drains of gain MOSFETs 342 and 345. Inductor 354 has a first terminal connected to the first terminal of variable capacitor 352, a second terminal connected to the second terminal of variable capacitor 352, and a center tap terminal connected to $V_{dd}$. Tracking bandpass filter 355 includes a variable capacitor 357 and an inductor 359. Variable capacitor 357 has a first terminal connected to the drains of gain MOSFETs 333 and 336, and a second terminal connected to the drains of gain MOSFETs 343 and 346. Inductor 359 has a first terminal connected to the first terminal of variable capacitor 357, a second terminal connected to the second terminal of variable capacitor 357, and a center tap terminal connected to $V_{dd}$.

Input section 380 includes an RF input which is modeled as an RF signal source 382, and a source impedance 384. Input section 380 also includes a transformer 386 that includes a primary winding 387, and a secondary winding 388. RF signal source 382 includes a first terminal connected to $V_{SS}$, and a second terminal. Source impedance 384 has a first terminal connected to the second terminal of RF signal source 382, and a second terminal. Primary winding 387 has a first terminal connected to the second terminal of source impedance 384, and a second terminal connected to the first terminal of RF signal source 382. Secondary winding 388 has a first terminal connected to the first terminal of capacitor 311 for providing $V^{+}_{IN}$, and a second terminal connected to the first terminal of capacitor 321 for providing $V^{-}_{IN}$, and a center tap terminal connected to $V_{SS}$.

In operation, RF signal source 382 provides a source signal labeled "$RF_{SOURCE}$" from an antenna, a coaxial cable, or another suitable signal source. Source impedance 384 represents a characteristic impedance $Z_{SOURCE}$ of the particular antenna, coaxial cable, or other source. In a particular embodiment, $RF_{SOURCE}$ is a broadband television signal that includes channel content information in the 48-870 MHz range, and that is broadcast on a cable television system where $Z_{SOURCE}$ is approximately 75Ω. $RF_{SOURCE}$ is characterized as being a single ended signal, since the first terminal of RF signal source 382 is connected to $V_{SS}$.

Transformer 386 is connected to RF signal source 382 and source impedance 384 such that the signal energy from $RF_{SOURCE}$ is transmitted from primary winding 387 to secondary winding 388 to provide $V^{+}_{IN}$ and $V^{-}_{IN}$ respectively, at the first and second terminals of secondary winding 388. $V^{+}_{IN}$ and $V^{-}_{IN}$ are characterized as providing a differential voltage signal because secondary winding 238 includes the center tap terminal that is connected to $V_{SS}$. Thus, when $V^{+}_{IN}$ is a positive voltage signal, $V^{-}_{IN}$ is a negative voltage signal with substantially the same magnitude as $V^{+}_{IN}$. Further, the difference in voltage of $V^{+}_{IN}$ and $V^{-}_{IN}$ is substantially proportional to the voltage level of $RF_{SOURCE}$, depending on the winding ratio between primary winding 387 and secondary winding 388. In a particular embodiment, transformer 386 has a one-to-one winding ratio between primary winding 387 and secondary winding 388.

In addition to providing $V^{+}_{IN}$ and $V^{-}_{IN}$, the center tap terminal permits a DC path for a bias current to flow in front end 300, similarly to the way inductors 214 and 236 provide for a bias current to flow in LNA 200. However, unlike LNA 200, the input impedance $Z_{IN}$ of front end 300 does not form a parallel resonant LC network, and front end 300 does not share the narrow passband of LNA 200. As will be described further, below, in front end 300, $Z_{IN}$ is dominated by degeneration resistors 313, 317, 323, and 327, which allows front end 300 to operate as a wideband amplifier capable of receiving input signals in the range of 48-870 MHz.

In the following description, the operation of gain stage 370 will be described, and then the added functionality of additional gain stages 375 will be described. Gain stage 370 includes a positive signal path and a negative signal path. Each signal path includes a transconductance device and a network of cascode coupled devices. In the positive signal path, degeneration resistor 313 receives $V^{+}_{IN}$ and provides a voltage signal to the source of MOSFET 315. MOSFET 315 is configured as a transconductance amplifier, receiving the voltage signal and amplifying a drain-to-source current in response. Because only one of MOSFETs 331 through 333 is conductive, all of the amplified drain-to-source current flows in a selected one of dump MOSFET 331, gain MOSFET 332, or gain MOSFET 333. Similarly, in the negative signal path, degeneration resistor 323 receives $V^{-}_{IN}$ and provides a voltage signal to the source of MOSFET 325. MOSFET 325 receives the voltage signal and amplifies a drain-to-source current in response, and all of the amplified drain-to-source current flows in a selected one of dump MOSFET 341, gain MOSFET 342, or gain MOSFET 343. Degeneration resistors 313 and 323 determine a large part of the input impedance $Z_{IN}$ of front end 300, as described below, and function to improve the noise figure of front end 300.

A micro-controller unit (not illustrated), similar to MCU 190 is connected to MOSFETs 331-333 and 341-343, such that the micro-controller unit provides D1 to the gates of MOSFETs 331 and 341, G1 to the gates of MOSFETs 332 and 342, and G2 to the gates of MOSFETs 333 and 343. The micro-controller unit operates to assert one and only one of D1, G1, and G2 at a time. As such, when D1 is asserted, substantially all of the amplified drain-to-source current in MOSFETs 315 and 325 flows in MOSFETs 331 and 341, respectively. In this case, the signal current is said to be dumped, and the signal current of gain stage 370 is not presented to the additional elements of the receiver for further signal processing.

Further, when G1 is asserted, substantially all of the amplified drain-to-source current in MOSFETs 315 and 325 flows in MOSFETs 332 and 342, respectively. However, the amplified current signal produced by MOSFETs 315 and 325 are filtered by tracking bandpass filter 350 to produce $V^{+}_{OUT1}$ and $V^{-}_{OUT1}$, such that only the signal content of a selected channel is presented to the additional elements of the receiver for further signal processing. For example, tracking bandpass filter 350 may function to filter the amplified current signal into 6 MHz channels in the range of 48 to 120 MHz, and thus variable capacitor 352 can be tuned to pass a signal centered at 75 MHz with spectral content at 72-78 MHz.

Also, when G2 is asserted, substantially all of the amplified drain-to-source current in MOSFETs 315 and 325 flows in MOSFETs 333 and 343, respectively. However, the amplified current signal produced by MOSFETs 315 and 325 are filtered by tracking bandpass filter 355 to produce $V^{+}_{OUT2}$ and $V^{-}_{OUT2}$, such that only the signal content of a selected channel is presented to the additional elements of the receiver for further signal processing. For example, tracking bandpass filter 355 may function to filter the amplified current signal into 6 MHz channels in the range of 685 MHz to 870 MHz, and variable capacitor 357 can be tuned to pass a signal centered at 843 MHz with spectral content at 840-846 MHz.

Thus, in gain stage 370, LNA section 310 amplifies $V^{+}_{IN}$ and $V^{-}_{IN}$ to produce an amplified output current, and switch matrix section 330 functions to steer the amplified current to either a dump circuit to isolate the amplified output current from the additional elements of the receiver when D1 is asserted, to tracking bandpass filter 350 to produce $V^{+}_{OUT1}$ and $V^{-}_{OUT1}$ when G1 is asserted, or to tracking bandpass filter 355 to produce $V^{+}_{OUT2}$ and $V^{-}_{OUT2}$ when G2 is asserted.

Note that, at any particular time, the micro-control unit will assert one of D1, G1, or G2. In this way, a bias current is maintained at all times in gain stage 370. For example, when D1 is asserted, a bias current flows from $V_{dd}$, through MOSFETs 331 and 315, degeneration resistor 313, and secondary winding 388 to $V_{SS}$ in the positive signal side, and a bias current flows from $V_{dd}$, through MOSFETs 341 and 325, degeneration resistor 323 and secondary winding 388 to $V_{SS}$ in the negative signal side. When G1 or G2 are asserted, a similar bias current flows from $V_{dd}$, through the associated inductor 354 or 359, the associated switch matrix MOSFETs 332, 333, 342, and 344, gain MOSFETs 315 and 325, degeneration resistors 313 and 323, and secondary winding 388, to $V_{SS}$. Here, by using secondary winding 388 in the bias circuit of front end 300, additional bias inductors are not necessary, and the resulting receiver will need fewer added components and be less expensive to produce.

Gain stage 375 functions similarly to gain stage 370 in which degeneration resistors 317 and 327 receive $V^+_{IN}$ and $V^-_{IN}$, respectively, and provide voltage signals to the sources of MOSFETs 319 and 329. MOSFETs 319 and 329 amplify drain-to-source currents in response to the voltage signals, and the amplified drain-to-source currents will flow in one of the associated switch matrix section 330 MOSFETs 334-336 and 344-346. The micro-controller unit is connected to MOSFETs 334-336 and 344-346, such that the micro-controller unit provides D2 to the gates of MOSFETs 334 and 344, G3 to the gates of MOSFETs 335 and 345, and G4 to the gates of MOSFETs 336 and 346. As with gain stage 370, the micro-controller unit operates to assert one and only one of D2, G3, and G4 at a time, and substantially all of the amplified drain-to-source current from MOSFETs 319 and 329 flows in the selected MOSFET pair 334 and 344 to the dump circuit, 335 and 345 to tracking bandpass filter 350, or 336 and 346 to tracking bandpass filter 355. Thus gain stage 375, LNA section 310 amplifies $V^+_{IN}$ and $V^-_{IN}$ to produce an amplified output current, and switch matrix section 330 steers the amplified current to either the dump circuit when D1 is asserted, to tracking bandpass filter 350 to produce $V^+_{OUT1}$ and $V^-_{OUT1}$ when G3 is asserted, or to tracking bandpass filter 355 to produce $V^+_{OUT2}$ and $V^-_{OUT2}$ when G4 is asserted.

As with gain stage 370, at any particular time, the micro-control unit will assert one of D2, G3, or G4, maintaining a bias current in gain stage 375. However, only one tracking bandpass filter 350 or 355 is selected at a time. Thus, for example, if gain stage 370 is providing signal current to tracking bandpass filter 350, then gain stage 375 may also provide signal current to tracing bandpass filter 350, but may not provide signal current to tracking bandpass filter 355. Table 1 illustrates the permitted combinations for the operation of switching section 330.

TABLE 1

Switching Section Operation

| D1 | G1 | G2 | D2 | G3 | G4 | Result |
|---|---|---|---|---|---|---|
| 1 | 0 | 0 | 1 | 0 | 0 | RF signal dump |
| 0 | 1 | 0 | 1 | 0 | 0 | RF signal to TBPF 350 - One gain stage (370) |
| 1 | 0 | 0 | 0 | 1 | 0 | RF signal to TBPF 350 - One gain stage (375) |
| 0 | 1 | 0 | 0 | 1 | 0 | RF signal to TBPF 350 - Two gain stages (370 & 375) |
| 0 | 0 | 1 | 1 | 0 | 0 | RF signal to TBPF 355 - One gain stage (370) |
| 1 | 0 | 0 | 0 | 0 | 1 | RF signal to TBPF 355 - One gain stage (375) |
| 0 | 0 | 1 | 0 | 0 | 1 | RF signal to TBPF 355 - Two gain stages (370 & 375) |

Thus, if the micro-controller unit asserts both D1 and D2, as shown in the first row of Table 1, then the amplified output current is isolated from the additional elements of the receiver, and subsequent RF or IF processing is not performed on the received signal. The second through the fourth rows show the conditions where the micro-controller unit tracking asserts one or more of G1 and G3, thus selecting bandpass filter 350 to produce $V^+_{OUT1}$ and $V^-_{OUT1}$. In the second row, G1 is asserted and gain stage 370 provides the signal current to tracking bandpass filter 350, and D2 is asserted to dump the current from gain stage 375. In the third row, G3 is asserted and gain stage 375 provides signal current, and D1 is asserted to dump the current from gain stage 370. In the fourth row, both G1 and G3 are asserted, such that both gain stages 370 and 375 provide signal current to tracking bandpass filter 350. The fifth through the seventh rows show the conditions for selecting tracking bandpass filter 355, by asserting G2, G4, or both.

Front end 300 is able to provide $V^+_{OUT1}$ and $V^-_{OUT1}$, and $V^+_{OUT2}$ and $V^-_{OUT2}$ at a suitable power level for the selected tracking bandpass filters 350 or 355 and the additional elements of the receiver by selecting more or less gain stages 370 through 375 to provide signal current to tracking bandpass filters 350 and 355. The micro-controller unit uses inputs from a power detector to determine the number of gain stages 370 and 375 to select, thus achieving digital automatic gain control in the receiver. In a particular embodiment, each gain stage provides substantially the same amount of gain and the total gain is a linear function of the number of stages. In another embodiment, the gain stages provide a binary weighted amount of gain. In yet another embodiment, a group of gain stages provide linear gain, and another group of gain stages provide binary weighted gain. Further, by dividing the overall gain into multiple gain stages 370 through 375, and making front end 300 a differential amplifier, large input signals are handled without having to make each component large enough to handle all of the input power. Additionally, making the individual components of front end 300 smaller leads to further improvements in gain linearity and noise figure.

After reading this disclosure, one will understand that an amplifier configuration with cross-coupled capacitors such as front end 300 will have further improvements in noise figure and in gain linearity as the input impedance is reduced. However, it will also be understood that a larger mismatch between the input impedance of the amplifier and the output impedance of the signal source will lead to larger amounts of the input signal energy being reflected back from the receiver. In a terrestrial application, higher impedance mismatch can be permissible because the transmitter is typically remote from the receiver, and the reflected signal energy is not likely to interfere with the transmitter or other receivers. However, in a cable application, where another receiver may be as close as the next house or apartment, the impedance matching requirement is typically more stringent, and cable television receivers are typically designed to have approximately a 1:1 impedance match between the source and the receiver. In the present embodiment, a tradeoff is made between impedance match and the consequent noise figure. Thus, in a particular embodiment, where $Z_{SOURCE}$ is 75Ω, $Z_{IN}$ is approximately 25Ω.

In front end 300, $Z_{IN}$ is determined as the parallel resistance of all of the gain stages 370 through 375. Thus:

$$Z_{IN} = \frac{Z_{STAGE}}{N} \quad [4]$$

where $Z_{STAGE}$ is the input impedance of a single gain stage 370 or 375. Thus:

$$Z_{STAGE} = N \times Z_{IN} \quad [5]$$

For example, in an embodiment with 64 gain stages and $Z_{IN}$ of approximately 25Ω, the input impedance of stage is approximately 1600Ω, and the input impedance of each of the positive and negative signal paths is approximately 3200Ω. It should be noted that:

$$Z_{PATH} = Z_{DEG} + Z_{GAIN} \quad [6]$$

where $Z_{PATH}$ is the input impedance of the positive or negative signal path in a gain stage, ZDEG is the resistance of degeneration resistor in the signal path, and $Z_{GAIN}$ is the impedance of the gain MOSFET in the signal path. In a particular embodiment, $Z_{DEG}$ in degeneration resistors 313, 317, 323, and 327 is approximately 640Ω.

Figure 4:
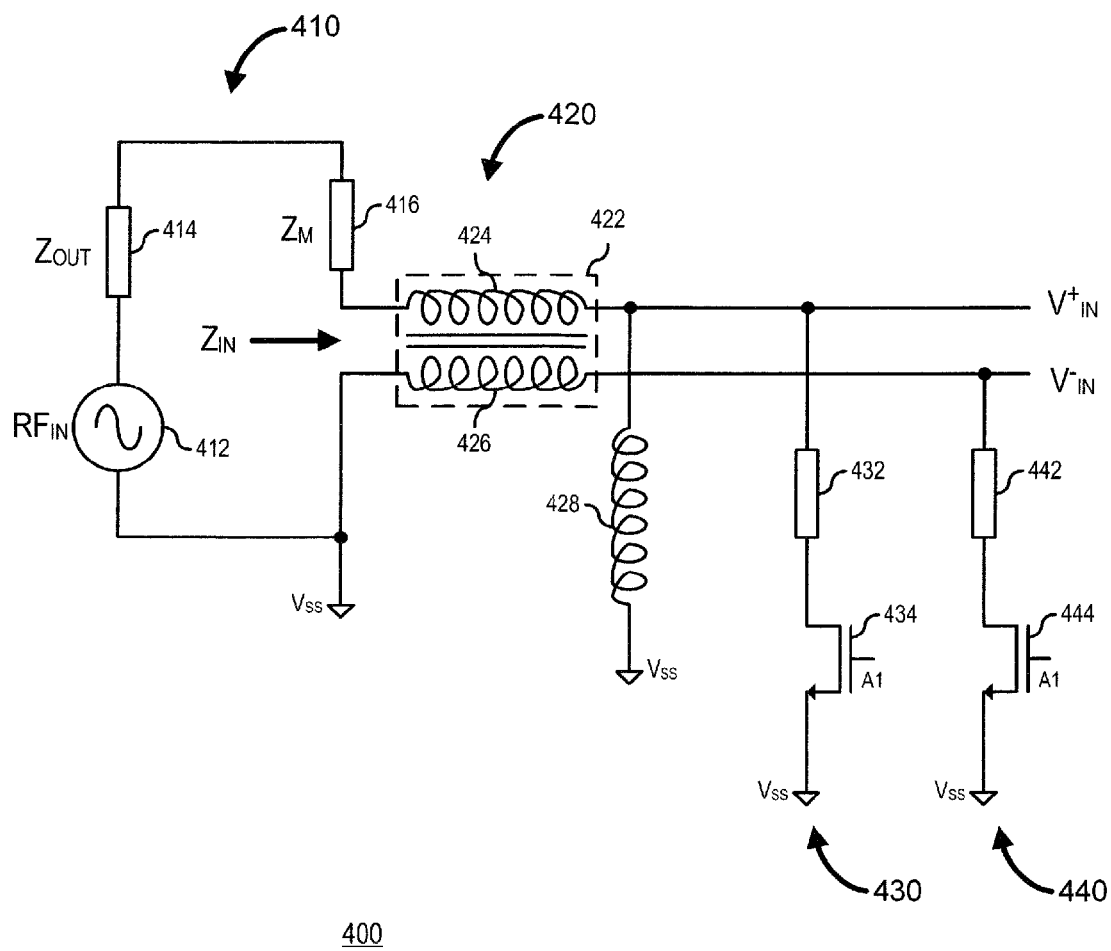
FIG. 4 illustrates in schematic form an input circuit for use with the low-noise amplifier of FIG. 3.

FIG. 4 illustrates a schematic of an alternative input circuit 400 for use with front end 300 of FIG. 3. Input circuit 400 can be part of a front end similar to front end 300, and provides differential inputs labeled "$V^+_{IN}$" and "$V^-_{IN}$". Input circuit 400 includes an antenna section 410, a balun section 420, and signal attenuator sections 430 and 440. Input section 410 includes an RF input which is modeled as an RF signal source 412, and a characteristic impedance 414, and an impedance matching resistor 416. RF signal source 412 includes a first terminal connected to $V_{SS}$, and a second terminal. Characteristic impedance 414 has a first terminal connected to the second terminal of RF signal source 412, and a second terminal. Impedance matching resistor 416 has a first terminal connected to the second terminal of antenna impedance 414, and a second terminal.

Balun section 420 includes a transformer 422 that has a primary winding 424, and a secondary winding 426. Balun section 420 also includes an inductor 428. Primary winding 424 has a first terminal connected to the second terminal of impedance matching resistor 416, and a second terminal for providing $V^+_{IN}$. Secondary winding 426 has a first terminal connected to the first terminal of RF signal source 412, and a second terminal for providing $V^-_{IN}$. Inductor 428 has a first terminal connected to the second terminal of primary winding 424, and a second terminal connected to $V_{SS}$.

Attenuator section 430 includes a resistor 432 and a MOSFET 434. Resistor 432 has a first terminal connected to the second terminal of primary winding 422, and a second terminal. MOSFET 434 has a drain connected to the second terminal of resistor 432, a gate for receiving an attenuation signal labeled "A1," and a source connected to $V_{SS}$. Attenuator section 440 includes a resistor 442 and a MOSFET 444. Resistor 442 has a first terminal connected to the second terminal of primary winding 426, and a second terminal. MOSFET 444 has a drain connected to the second terminal of resistor 442, a gate for receiving attenuation signal A1, and a source connected to $V_{SS}$.

In operation, in input section 410, RF signal source 412 provides a source RF signal $RF_{IN}$ from an antenna, a coaxial cable, or another suitable signal source. Characteristic impedance 414 represents an output impedance $Z_{OUT}$ of the particular antenna, coaxial cable, or other source. In a particular embodiment, $RF_{IN}$ is a broadband television signal that includes channel content information in the 48-870 MHz range, and that is broadcast on a cable television system where $Z_{IN}$ is approximately 75Ω. $RF_{IN}$ is characterized as being a single ended signal, since the first terminal of RF signal source 412 is connected to $V_{SS}$. Matching resistor 416 is an impedance matching resistor with a resistance of $Z_M$. Matching resistor 416 is added to input section 410 to reduce reflections from the receiver back into the signal source. As such, the signal source sees an effective input of:

$$Z_{IN\text{-}TOTAL} = Z_{IN} + Z_M \quad [7]$$

where $Z_{IN\text{-}TOTAL}$ is the total input impedance, and $Z_{IN}$ is the input impedance of an LNA that receives $V^+_{IN}$ and $V^-_{IN}$.

When, as described in an embodiment above, the input impedance of an LNA connected to input circuit is approximately 25Ω, matching resistor 416 can have a value in the range of 0Ω to 100Ω to reduce the impedance mismatch. In a particular embodiment, $Z_M$ is approximately 10Ω.

In balun section 420, transformer 422 is connected to input section 410 such that the signal energy from $RF_{IN}$ is transmitted through primary winding 424 and secondary winding 426. Inductor 428 is added to convert $V^+_{IN}$ and $V^-_{IN}$ into a differential signal pair. Balun section 420 provides for a bias current to flow in the connected LNA, similarly to the way the center tap terminal of secondary winding 388 provides for a bias current to flow in front end 300. However, here, the bias current in the positive signal side will flow through inductor 428 to $V_{SS}$, and the bias current in the negative signal side will flow through secondary winding 426 to $V_{SS}$.

In attenuator sections 430 and 440, a micro-controller unit (not illustrated), similar to MCU 190 is connected to MOSFETs 434 and 444, such that the micro-controller unit provides A1 to the gates of MOSFETs 434 and 444. The micro-controller unit operates in response to a power detector (not illustrated) which notes the presence of input signals $RF_{IN}$ which may be large enough to damage the connected LNA or other receiver elements. When such a large input signal $RF_{IN}$ is detected, the micro-controller unit asserts A1, turning on MOSFETs 434 and 444, permitting a portion of signal current to flow in resistors 432 and 442, and thus attenuating the input signal to a level more tolerable to the connected LNA and other receiver elements. In a particular embodiment, resistors 434 and 444 have a resistance of 7Ω.

The above-disclosed subject matter is to be considered illustrative, and not restrictive, and the appended claims are intended to cover all such modifications, enhancements, and other embodiments that fall within the true scope of the claims. Thus, to the maximum extent allowed by law, the scope of the present invention is to be determined by the broadest permissible interpretation of the following claims and their equivalents, and shall not be restricted or limited by the foregoing detailed description.

What is claimed is:

1. A low-noise amplifier, comprising:
   a first resistor having a first terminal for receiving a first signal of a differential input signal, and a second terminal;
   a first transconductance device having a first electrode coupled to said second terminal of said first resistor, a second electrode for providing a first signal of a first differential output signal, and a control electrode;
   a first capacitor having a first terminal coupled to said first terminal of said first resistor, and a second terminal;
   a second resistor having a first terminal for receiving a second signal of said differential input signal, and a second terminal;
   a second transconductance device having a first electrode coupled to said second terminal of said second resistor, a second electrode for providing a second signal of said first differential output signal, and a control electrode coupled to said second terminal of said first capacitor; and
   a second capacitor having a first terminal coupled to said first terminal of said second resistor, and a second terminal coupled to said control electrode of said first transconductance device.

2. The low-noise amplifier of claim 1, further comprising:
   a first switch device having a first electrode coupled to said second electrode of said first transconductance device, a second electrode for providing a first signal of a first switched differential output signal, and a control electrode for receiving a first gain control signal; and
a second switch device, having a first electrode coupled to said second electrode of said second transconductance device, a second electrode for providing a second signal of said first switched differential output signal, and a control electrode for receiving said first gain control signal.

3. The low-noise amplifier of claim 2, further comprising:
a third switch device having a first electrode coupled to said second electrode of said first transconductance device, a second electrode coupled to a common source terminal, and a control electrode for receiving a first dump control signal; and
a fourth switch device having a first electrode coupled to said second electrode of said second transconductance device, a second electrode coupled to said common source terminal, and a control electrode for receiving said first dump control signal.

4. The low-noise amplifier of claim 3, wherein:
when said first dump control signal is asserted, said first gain control signal is not asserted; and
when said first gain control signal is asserted, said first dump control signal is not asserted.

5. The low-noise amplifier of claim 3, further comprising:
a fifth switch device having a first electrode coupled to said second electrode of said first transconductance device, a second electrode for providing a first signal of a second switched differential output signal, and a control electrode for receiving a second gain control signal; and
a sixth device having a first electrode coupled to said second electrode of said second transconductance device, a second electrode for providing a second signal of said second switched differential output signal, and a control electrode for receiving said second gain control signal.

6. The low-noise amplifier of claim 5, wherein:
when said first dump control signal is asserted, said first gain control signal is not asserted, and said second gain control signal is not asserted;
when said first gain control signal is asserted, said first dump control signal is not asserted, and said second gain control signal is not asserted; and
when said second gain control signal is asserted, said first dump control signal is not asserted, and said first gain control signal is not asserted.

7. The low-noise amplifier of claim 4, further comprising:
a third resistor having a first terminal coupled to said first terminal of said first resistor, and a second terminal;
a third transconductance device having a first electrode coupled to said second terminal of said third resistor, a second electrode for providing a first of a second differential output signal, and a control electrode coupled to said second terminal of said second capacitor;
a fourth resistor having a first terminal coupled to said first terminal of said second resistor, and a second terminal; and
a fourth transconductance device having a first electrode coupled to said second terminal of said fourth resistor, a second electrode for providing a second signal of said second differential output signal, and a control electrode coupled to said second terminal of said first capacitor.

8. The low-noise amplifier of claim 7, further comprising:
a fifth switch device having a first electrode coupled to said second electrode of said third transconductance device, a second electrode coupled to said second electrode of said first switch device, and a control electrode for receiving a third gain control signal;
a sixth switch device having a first electrode coupled to said second electrode of said fourth transconductance device, a second electrode coupled to said second electrode of said second switch device, and a control electrode for receiving said third gain control signal;
a seventh switch device having a first electrode coupled to said second electrode of said third transconductance device, a second electrode coupled to said common source terminal, and a control electrode for receiving a second dump control signal; and
an eighth switch device having a first electrode coupled to said second electrode of said fourth transconductance device, a second electrode coupled to said common source terminal, and a control electrode for receiving said second dump control signal; and
wherein:
when said second dump control signal is asserted, said second gain control signal is not asserted; and
when said second gain control signal is asserted, said second dump control signal is not asserted.

9. The low-noise amplifier of claim 1, further comprising:
a first attenuator circuit coupled between said first terminal of said first resistor and a common ground terminal, said first attenuator circuit including a third resistor coupled in series with a first switch device, and wherein said first switch device includes a control electrode adapted to receive an attenuation control signal; and
a second attenuator circuit coupled between said first terminal of said second resistor and said common ground terminal, said second attenuator circuit including a fourth resistor coupled in series with a second switch device, and wherein said second switch device includes a control electrode adapted to receive said attenuation control signal.

10. The low-noise amplifier of claim 1, wherein:
said first signal of said first differential input signal includes a first bias current for said first transconductance device; and
said second signal of said first differential input signal includes a second bias current for said second transconductance device.

11. The low-noise amplifier of claim 10, wherein said first differential input signal is coupled to a secondary winding of a transformer, wherein said secondary winding includes a center tap coupled to a common ground terminal, and wherein a primary winding of said transformer is coupled to an antenna for receiving a radio frequency signal.

12. The low-noise amplifier of claim 10, wherein:
said first signal of said first differential input signal is coupled to:
a first terminal of a first winding of a balun, wherein a second terminal of said first winding is coupled to a first output of an antenna; and
a first terminal of an inductor, wherein said second terminal of said inductor is coupled to a common ground terminal; and
said second signal of said first differential input signal is coupled to a first terminal of a second winding of said balun, wherein a second terminal of said second winding is coupled to a second output of said antenna and to said common ground terminal.

13. A low-noise amplifier comprising:
a first capacitor having a first terminal for receiving a first signal of a differential input signal, and a second terminal;

a second capacitor having a first terminal for receiving a second signal of said differential input signal, and a second terminal;

a plurality of gain stages, wherein each of said plurality of gain stages includes:

a first resistor having a first terminal coupled to said first terminal of said first capacitor, and a second terminal;

a second resistor having a first terminal coupled to said first terminal of said second capacitor, and a second terminal;

first transconductance device having a first electrode coupled to said second terminal of said first resistor, a second electrode adapted to provide a first signal of a differential output signal, and a control electrode coupled to said second terminal of said second capacitor;

a second transconductance device having a first electrode coupled to said second terminal of said second resistor, a second electrode adapted to provide a second signal of a differential output signal, and a control electrode coupled to said second terminal of said first capacitor.

14. The low-noise amplifier of claim 13, wherein each of said plurality of gain stages further includes:

a first switch having a first electrode coupled to said second electrode of said first transconductance device, a second electrode adapted to provide a first signal of a switched differential output signal, and a control electrode adapted to receive a gain control signal; and a second switch having a first electrode coupled to said second electrode of said second transconductance device, a second electrode adapted to provide a second signal of said switched differential output signal, and a control electrode adapted to receive said gain control signal.

15. The low-noise amplifier of claim 14, wherein each of said plurality of gain stages further includes:

a third switch device having a first electrode coupled to said second electrode of said first transconductance device, a second electrode coupled to a common source terminal, and a control electrode adapted to receive a dump control signal; and a fourth switch device having a first electrode coupled to said second electrode of said second transconductance device, a second electrode coupled to said common source terminal, and a control electrode adapted to receive said dump control signal.

16. The low-noise amplifier of claim 15, wherein for each of said plurality of gain stages:

when said dump control signal is asserted, said gain control signal is not asserted; and when said gain control signal is asserted, said dump control signal is not asserted.

17. The low-noise amplifier of claim 16, wherein for each particular gain stage of said plurality of in stages, said gain control signal is asserted in response to a detected power level of said differential input signal.

18. The low-noise amplifier of claim 13, further comprising:

a first attenuator circuit coupled between said first terminal of said first capacitor and a common ground terminal, said first attenuator circuit including a third resistor coupled in series with a first switch device, and wherein said first switch device includes a first electrode adapted to receive an attenuation control signal; and a second attenuator circuit coupled between said first terminal of said second capacitor and said common ground terminal, said second attenuator circuit including a fourth resistor coupled in series with a second switch device, and wherein said second switch device includes a second electrode adapted to receive said attenuation control signal.

19. A front end circuit suitable for use in a broadband television receiver, comprising:

a transformer having a primary winding adapted to be coupled to an antenna, and a secondary winding having a first terminal for providing a first signal of a differential input signal, a second terminal for providing a second signal of said differential input signal, and a center tap coupled to a common ground terminal;

a low noise transconductance amplifier, comprising:

a first resistor having a first terminal for receiving said first signal, and a second terminal;

a first transconductance device having a first electrode coupled to said second terminal of said first resistor, a second electrode for providing a first signal of first differential output signal, and a control electrode;

a first capacitor having a first terminal coupled to said first terminal of said first resistor, and a second terminal;

a second resistor having a first terminal for receiving said second signal, and a second terminal;

a second transconductance device having a first electrode coupled to said second terminal of said second resistor, a second electrode for providing a second signal of said first differential output signal, and a control electrode coupled to said second terminal of said first capacitor; and a second capacitor having a first terminal coupled to said first terminal of said second resistor, and a second terminal coupled to said control electrode of said first transconductance device.

20. The front end circuit of claim 19, wherein said low noise transconductance amplifier is characterized as being inductorless.

* * * * *